United States Patent
Kumakhov

(10) Patent No.: US 6,865,251 B2
(45) Date of Patent: Mar. 8, 2005

(54) DEVICE FOR X-RAY LITHOGRAPHY

(76) Inventor: Muradin Abubekirovich Kumakhov, ul. Narodnogo Opolcheniya, d. 38, kv. 55, Moscow 123298 (RU)

( * ) Notice: Subject to any disclaimer, the term of this patent is extended or adjusted under 35 U.S.C. 154(b) by 0 days.

(21) Appl. No.: 10/203,020

(22) PCT Filed: Apr. 3, 2001

(86) PCT No.: PCT/RU01/00134
§ 371 (c)(1),
(2), (4) Date: Nov. 8, 2002

(87) PCT Pub. No.: WO02/054413
PCT Pub. Date: Jul. 11, 2002

(65) Prior Publication Data
US 2003/0116529 A1 Jun. 26, 2003

(30) Foreign Application Priority Data
Dec. 29, 2000 (RU) .................. 2000133040

(51) Int. Cl.$^7$ .................. G21K 5/00; G21K 1/06
(52) U.S. Cl. .................. 378/34; 378/64; 378/84; 378/147; 378/149
(58) Field of Search .................. 378/34, 64, 84, 378/85, 147, 149, 156, 159; 250/505.1

(56) References Cited

U.S. PATENT DOCUMENTS

| 4,969,169 A | | 11/1990 | Forsyth | 378/34 |
| 5,175,755 A | | 12/1992 | Kumakhov | 378/34 |
| 5,497,008 A | * | 3/1996 | Kumakhov | 250/505.1 |
| 5,570,408 A | * | 10/1996 | Gibson | 378/145 |
| 5,745,547 A | * | 4/1998 | Xiao | 378/145 |
| 5,768,339 A | * | 6/1998 | O'Hara | 378/147 |
| 5,812,631 A | * | 9/1998 | Yan et al. | 378/85 |
| 6,271,534 B1 | * | 8/2001 | Kumakhov | 250/505.1 |

FOREIGN PATENT DOCUMENTS

| RU | 2109358 | 4/1998 |
| RU | 2122757 | 11/1998 |
| SU | 1639313 | 4/1998 |

OTHER PUBLICATIONS

English translation of SU 1639313 Abstract.
English translation of RU 2109358 Abstract.
English translation of RU 2122757 Abstract.

* cited by examiner

Primary Examiner—David V. Bruce
Assistant Examiner—Allen C. Ho
(74) Attorney, Agent, or Firm—William H. Holt

(57) ABSTRACT

A lithography device including a soft X-ray source 1 transforming to a quasi-parallel radiation apparatus for placing a mask 3 and a plate-substrate 4 coated with a resist 5, and an absorbing filter 6 for smoothing of intensity decreasing as from the center to the periphery of a beam. The filter 6 is placed between the source 1 and the input face of the half-lens 2. The half-lens has an enlarged capture angle. This angle is chosen depending on radiation energy (0.6–6 keV) of the source 1. As a result, there is an opportunity to increase the size of the plate-substrate.

2 Claims, 1 Drawing Sheet

DEVICE FOR X-RAY LITHOGRAPHY

The invention relates to means for X-ray contact lithography used in microelectronics, namely for lithography devices, which use X-ray lenses for forming an X-ray quasi-parallel beam.

BACKGROUND OF THE INVENTION

The first information about such devices relates to the end of the 1980's. Some works, describing the application of X-ray lenses in lithography devices, one can find in: "Book of Abstracts. 3$^{rd}$ All-Union Conference on Relativistic Particles Radiation in Crystals. May 25–30, 1988". (Nalchik, 1988) [1]. If a divergent radiation source is used these devices comprise a lens, transforming the radiation to a quasi-parallel one directed through the mask on the resist, applied on the substrate. The lens comprises a set of channels for directing radiation curved along a barrel-shaped generatrix. An effect of multiple total external reflections from the walls of the channels is used when a radiation is transmitted. As a whole, a lens for a divergent radiation changing to a quasi-parallel one is half barrel-shaped and it is called a half lens as distinguished from a full lens, which focuses a divergent X-rays and is barrel-shaped.

More detailed information about the X-ray lithography devices including all elements of such devices mentioned above are described in the review "Multiple Reflection From Surface X-ray Optics," (M. A. Kumakhov and F. F. Komarov. PHYSICS REPORTS. A review Section of Physics Letters, volume 191, number 5, August 1990. North-Holland) [2], p. 345–348).

Non-uniform radiation intensity decreasing toward a periphery of the output face of a lens, falling on a mask, is a disadvantage of the described prior art devices. It becomes necessary to use filters in order to absorb "extra" radiation in the central section of the emergent beam of the lens. This solution was mentioned in source [1], however a structure of the device, comprising a filter, as a whole is described in U.S. Pat. No. 5,175,755 [3] (published Dec. 29, 1992). Locating the absorbing filter after the half lens, before or after the mask, is described in this patent.

The second mentioned variant of placing an absorbing filter is obviously poor, as according to this variant a radiation of extra intensity exposures on the central part of the mask, being an expensive precise unit, will result in destruction of the mask Further, the influence of actual out-of-parallelism of emergent radiation of a half lens appears in this variant to a greater extent. This radiation divergence determines the increased spreading of shadowgraph after the mask the greater the distance after the mask. Placing the filter after the mask inevitably increases this distance.

The first variant i.e., placing a filter between a half lens and a mask, is more desirable. However according to this variant as well a radiation, which extra intensity should be attenuated, passes through another expensive unit of the device, an X-ray half lens, what results in its aging.

The influence of the aforesaid factors leads to refusal of usage of absorbing filters, in particular if it is necessary "to smooth" great difference between a radiation intensity in the central and peripheral parts of the cross-section of the emergent beam, when a radiation intensity, being transported along the central channels of the lens, exceeds a lot a radiation intensity after the filter. This, in its turn, requires the use of rather "thin" lenses for making the difference small. Such lenses have a small capture angle of radiation, emerging from the source.

Also, fostering the usage of "thin" lenses with a rather small capture angle in X-ray lithography, is a sharp drop of transmission coefficient of a lens at a radiation rotation angle (when a half lens is used it is equal to a half of a capture angle) exceeding some limit value. So, according to calculations (see the results in source [2], p. 318), this value is equal to 0.3–0.40 radian. As this effect is well known, it is considered that further increasing of a capture angle will not increase an integral intensity of an emergent beam. The necessity to suppress a radiation intensity in the center of the beam "to equalize" it with a low peripheral level of intensity seems to be a very strong factor, making no point in using a small capture angle in lithography. So, for instance, in the work: M. A Kumakhov. "State and Perspectives of Capillary Roentgen Optics," Proceedings of SPIE—The International Society for Optical Engineering. Volume 2011, 14–16 Jul. 1993, San Diego, Calif. [4] real lithography devices with a capture angle of a half lens from 0.15 up to 0.3 radian are described. Such half lenses capture not more than 1–2% of an isotope source radiation.

Another result of using "thin" half lenses is a small cross-section of the emergent beam, what makes possible to irradiate only a small part of the substrate area with a resist, applied on it. To process the whole area it is necessary to use stepwise irradiation. In spite of using special high-precise devices for this purpose, it is impossible to avoid errors, caused by errors in conjugation of neighboring zones under exposure.

Thus, the present invention is aimed at obtaining a technical result, implying that the usage of a source radiation increases simultaneously with enlarging of the area of a plate under exposure and increasing a lens longevity. This technical result can be obtained owing to the combination of two expedients: (1) an absorbing filter is placed between a source and a half lens and (2) a half lens with larger capture angle is used. For the latter an existence of an optimum value, considerably exceeding the aforesaid limit values and depending on an energy of the used radiation and material properties of reflecting surfaces of the channels of a half lens (i.e. a material, the channels are made of if they are not applied, or a material applied if exists), has revealed. In the energy range of a radiation being used from 0.6 keV up to 6 keV an optimum value of a capture angle depends only on a radiation energy. A material, a reflecting surface of the channels is made of, can be any one, feasible from the technological point of view for producing the channels of an X-ray lens or for their inner surface applying on condition that it contains only light elements, i.e., the atomic number should be not more than 22.

Further, U.S. Pat. No. 5,175,755 described a source of a soft X-rays, a half lens for a divergent radiation of this source transforming to a quasi-parallel one, the lens includes a set of channels for transmitting radiation with a total external reflection, and the channels are oriented along a generatrix of barrel-shaped surfaces, the means for placing a mask and a substrate with a resist applied on it being located on the side of an output face of a half lens, and an absorbing filter for smoothing a nonuniformity of a beam intensity of an emergent radiation of a half lens, so that the intensity decreases from the center to the beam periphery.

Contrary to the suggested device, an absorbing filter is placed between a radiation source and an input face of a half lens, and the relationship of the half lens cross sizes and a focal distance from the side of an input is chosen for providing a capture angle of a source radiation in the following limits:

$$0.7/E^{1.5} \leq \Psi \leq 1.3/E^{1.5}, \quad (1)$$

where ψ is a capture angle [rad];

E is a radiation energy of a used source [keV], thus a material of a reflecting surface of the channels for transmitting radiation includes the elements with an atomic number not more than 22, and a radiation energy of a used source is from 0.6 up to 6 keV.

A relationship (1) is empirical; therefore to obtain a proper result the values appear in it should be expressed in the aforesaid terms.

It is preferable to use an X-ray tube with a rotating anode as a source of soft X-rays.

DESCRIPTION OF THE PREFERRED EMBODIMENT

Figure 1:
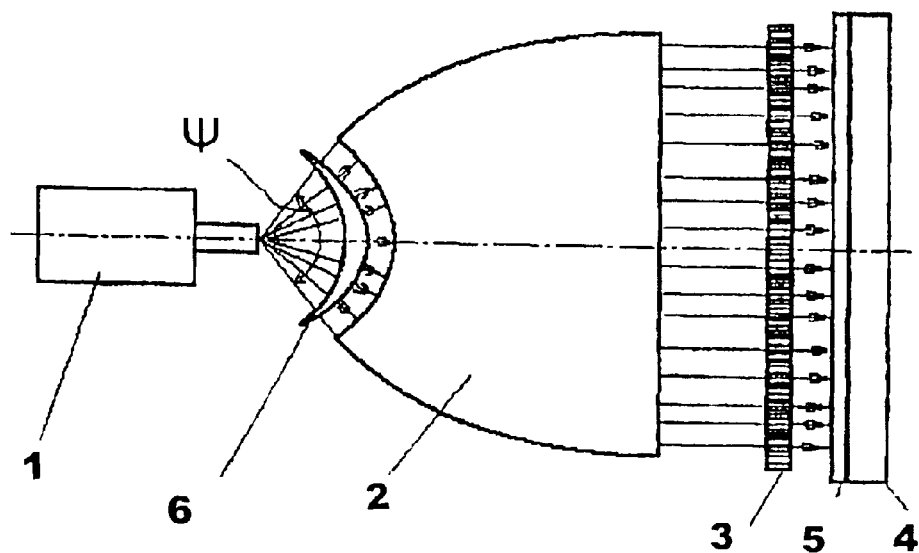
FIG. 1 depicts a respective placing of the members of a device for lithography.

An X-ray lithography device includes a source of divergent soft X-rays 1, wherein an output aperture is placed in the focus of a half lens 2. A mask 3 is located on the side of an output face of half lens 2. A plane of mask 3 is parallel to the output face of half lens 2, i.e. the mask 3 is perpendicular to a longitudinal axis of the half lens 2 and to an axial line of an emergent quasi-parallel radiation beam formed by the half lens 2.

A substrate 4 is placed with a layer of resist 5 applied on it and is located after the mask 3. The substrate 4 should be located so that a plane of resist 5 is parallel to a plane of mask 3, and it is spaced from the mask 3 at a minimum distance.

An absorbing filter 6 is placed between X-ray source 1 and the input face of half lens 2. The absorbing filter 6 represents a product made of material, absorbing an X-rays, as an axi-symmetric body, being relative to an axis combined with a longitudinal axis of a half lens. A thickness of the absorbing filter 6 is a minimum at its peripheral part and it becomes thicker as approaching its central part, adjacent to an axis of symmetry. A law of changing of thickness of an absorbing filter 6 as a function of a distance from the axis of symmetry (the said axis of symmetry, being combined with a longitudinal axis of a lens 2 when a filter is placed) is chosen for obtaining a uniform intensity of a beam along a cross section on the output of the lens. When the choice is executed a monitoring of radiation intensity distribution along the cross section of an emergent beam of a specific half lens, intended for usage in a given lithography device, is realized by means of one or other detecting means during operation of the device. The feature of changing of the thickness of an absorbing filter is of a character close to an exponential one. Such a filter can be made, in particular, as a substrate of a light metal (for instance, aluminum) and applied with a layer of more heavy metal (for instance, copper or lead), with thickness, decreasing to a periphery.

The novel X-ray lithography device works as follows.

A divergent radiation of source 1 passes through absorbing filter 6, which attenuates it in dependence on the deflection angle from the longitudinal axis of a half lens 2 in inverse proportion to impending attenuation when the radiation passes through the channels of half lens 2. Half lens 2 transforms a divergent input beam of radiation to a quasi-parallel one. Owing to aforesaid character of the input radiation attenuating the emergent radiation has an intensity distribution along the cross section of a beam close to a uniform one (practical tolerable nonuniformity is 5–10%). This radiation after passing through the transparent sections of the mask 3 reaches the resist 5, applied on the surface of the substrate 4 to be irradiated. As a result of the X-rays acting on the resist, sensitive to such radiation, "the windows" i.e., areas of resist sections of the substrate surface under irradiation, appear and the windows form an image which repeats the image of the mask 3.

From the point of view of imaging precision an actual divergence of the emergent quasi-parallel radiation of the half lens 2 and the distance between the mask and the resist are of essential importance, as the image spreading is of the following order:

$$\delta \approx d \cdot \Delta\theta,$$

where d is a distance between the mask 3 and the resist 5,

Δθ is a divergence angle of a quasi-parallel emergent radiation of half lens 2.

Thus, the substrate 4 is etched wherein an etchant acts on the surface under processing through the "windows" in the resist 5 and it does not act on the other sections, a layer of resist stable to the etchant retains on. As a whole this stage of a technological process does not differ from a traditional one (see, for instance, Encyclopedic dictionary "Electronics", Moscow, "Soviet encyclopedia", 1991 [5], pp. 254–256).

As it was mentioned above placing the absorbing filter 6 on the path of radiations of source 1 to the lens 2 protects a lens from excess radiation. In experiments, carried out with the usage of the power values of the source 1 discussed below, in the absence of an absorbing filter before the input face of a half lens face softening was observed. An absorbing filter is of no such fine structure as an X-ray half lens, and it is much more thermal resistant. Besides, a resist is a simple and cheap unit, which can be periodically changed.

The placing of an absorbing filter makes possible to exclude the action of a secondary scattered radiation, emerging in the filter, on the resist. If an absorbing filter is placed on the output of a half lens 2 this radiation would cause much more spreading, than spreading defined according to the formula (2), as this radiation is not quasi-parallel and its divergence is not limited by a small angle Δθ and can reach 90°.

Following are estimated calculations of possible coefficients and main constructive parameters of the suggested X-ray lithography device.

Presently, a diameter of plate-substrates about 30 cm (i.e. an area is about 750 cm$^2$) has been obtained. On the basis of desirable productivity of processing of 10 such plates per an hour, the area to be processed will be 7500 cm$^2$. A sensitivity of present X-ray resists is on the order of 20 mJ/cm$^2$. This means that 7500·20=150 000 mJ=150 J of X-rays energy should be delivered on the resist within 1 hour. A coefficient of power transformation, consumed by an X-ray tube, to create X-rays is defined by a formula:

$$g = k(U - U_k)^{1.5}, \qquad (3)$$

where k≈10$^{-4}$ (for X-rays with the quantum energy within the range under study);

$U_k$ is an ionization potential of the characteristic radiation [kV] under study;

U is voltage across the tube.

For instance, for $K_\alpha$ radiation of aluminum (E≈1.5 keV) at U−$U_k$=30 kV:

$g=1.65 \cdot 10^{-2}$, i.e. a transformation coefficient is on the order of 1%. As of now X-rays tubes with power consumption of 200 kW and more are produced. A tube of less than 30 kW power with a rotating anode will be considered to be used. Such tubes can work without repair within 10,000 hours, thus the required repair is of minor nature as the operating experience implies. Their overall dimensions and weight are small. At the described tube power, it is possible to obtain the following X-rays power $$30 \cdot 1.65 \cdot 10^{-2} = 0.495 \text{ kW} \approx 0.5 \text{ kW}.$$

Thus it should be taken into account that at least half of this energy is absorbed in the rotating anode. An additional 30% falls on the hard part of the radiation, which should be filtered (such a filtration is realized in the lens; see, for instance: M. A. Kumakhov. "Channeling Particles Radiation in Crystals." Moscow, Energoatomizdat, 10986 [6], p. 42). Altogether about 100 W from the said 0.5 kW will represent useful power, being emitted by an X-ray tube with a rotating anode. However this energy is emitted in a solid angle of $4\pi$.

The walls of the channels for transmitting radiation of half lens 2 are made of light metals or their oxides, light glasses, and so forth materials to provide good reflection and small absorption of used soft X-rays in the energy range 1–5 keV (if the inner surface of the channels is coated the aforesaid refers to the material of coating). Any materials, including elements with an atomic weight not more than 22 and being acceptable for capillary lenses producing from the technological point of view, are appropriate. A half lens 2 is made of polycapillaries or as a monolithic lens according to the technology, described in the work: V. M. Andreevsky, M. V. Gubarev, P. I. Zhidkin, M. A. Kumakhov, A. V. Noskin, I. Yu. Ponomarev, Kh. Z. Ustok, "X-ray Waveguide System With a Variable Cross-Section of the Sections." The IV-th All-Union Conference on Interaction of Radiation with Solids. Book of Abstracts (May 15–19, 1990, Elbrus settlement, Kabardino-Balkarian ASSR, USSR, pp. 177–178) [7].

If a radiation energy is E=1 keV according to the formula (1) we can evaluate:

$$0.7 \leq \Psi \leq 1.3.$$

As an example, $\Psi=60° \approx 1$ radian. If $\Psi=60°$ a half lens captures about 10% of isotropicly diverging radiation of a tube, i.e. approximately 10 W. If a radiation rotation angle is equal to 30° relevant to a respective capture angle 60°, taking place in peripheral channels of a lens, only about 5% of energy is transferred to a channel output. Excess of energy must be absorbed by filter 6 before radiation enters in the channels, placed more close to a longitudinal axes of a half lens. So, it is necessary to recognize that only 5% of energy, captured by a half lens, reaches its output and forms approximately uniform quasi-parallel beam at a cross-section.

It means that $5 \cdot 10^{-2} \cdot 10$ J=0.5 J=500 mJ falls on the mask per second. As it was described above it is necessary to obtain 150 J per an hour, i.e. 40 mJ per a second. So, the studied system, including a tube of 30 kW power and a half lens with 60° capture angle, meets accepted requirements with safety from the point of view of energetics of lithographic process.

Figure 2:
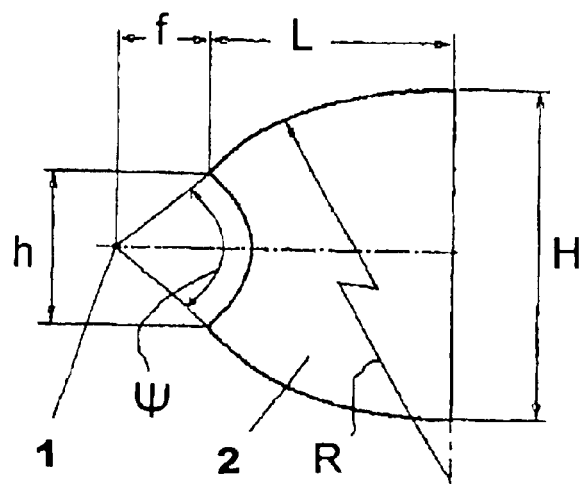
FIG. 2 depicts main constructive sizes of a half lens, used in the device of FIG. 1.

For main constructive sizes of a half lens (FIG. 2) one can derive the following formulas on the basis of relationships from the work: V. A. Arkadiev, M. A. Kumakhov. "Concentration of Synchrotron Radiation with Capillary Focusing Systems." Optic of beams, pp. 43–50. Institute for Roentgen Optical Systems. Moscow, 1993.

$$f = h/2tg(\psi/2), \quad (4)$$

$$h = H - 2L[1-\cos(\psi/2)]/\sin(\psi/2), \quad (5)$$

$$R = L/\sin(\psi/2), \quad (6)$$

where $\psi$ is a radiation capture angle;

f is a focal distance;

h is a an input diameter of a half lens;

H is an output diameter of a half lens;

L is a length of a half lens;

R is a curvature radius of a channel, being most distant from an optical axis of a half lens.

According to the aforesaid suggestions (i.e. a diameter of a plate-substrate is 30 cm) an output diameter of a half lens should approximate 30 cm as well. Let's accept, that a length of a half lens is 30 cm as well. With regard to that, one can calculate by the formulas (4)–(6) the values of the other sizes for a capture angle $\psi=60°$, defined above:

an input diameter of a lens h=13.8 cm, focal distance f=11.9 cm, a curvature radius of a channel, being most distant from an optical axis of a half lens, R=60 cm.

To estimate blurring of a mask image, transmitted on the resist, two factors, which define a divergence of an emergent radiation of half lens 2, should be taken into account. The first factor is a radiation divergence on the input of each channel of a half lens of the following order $$\Delta\theta_1 = l_0/f, \quad (7)$$

where $l_0$ is an aperture size of an X-ray source, f is a focal distance of a half lens 2.

The second factor is an out-of-parallelism of initially parallel rays after they were reflected from the curved wall of a channel. An influence of this factor is maximum for the peripheral channels, being the most curved (minimum curvature radius), and for input rays, being the most distanced from each other (i.e. this distance is equal to a diameter $d_0$ of a channel). A divergence, caused by this factor, of an output radiation is equal to $$\Delta\theta_2 = (2d_0/R)^{1/2}, \quad (8)$$

where $d_0$ is a diameter of a channel for a radiation transporting,

R is a curvature radius of a channel, being most distant from an optical axis of a half lens.

To determine a resulting divergence, taking into account a random and independent character of an influence of the said factors, let's add quadratically divergences, defined by the formulas (7) and (8):

$$\Delta\theta = [(\Delta\theta_1)^2 + (\Delta\theta_2)^2]^{1/2} = [(l_0/f)^2 + 2d_0/R]^{1/2}. \quad (9)$$

So, if a focal distance is f=11.9 cm and a typical value $l_0$=1 mm for a diameter of the channels $d_0$=5 micron, obtained above, a divergence is of $\Delta\theta \approx 10^{-2}$ radian order.

At such a divergence and a typical distance value between a mask 3 and a layer of a resist 5 wherein d=20 micron an image blurring, defined by the formula (2), is of $\delta$=0.2 micron order.

The obtained results testify that a submicron resolution using plate-substrates of large (up to 30 cm) sizes without stepping and processing efficiency up to 10 plates per an hour can be realized by means of the suggested device.

The usage of radiation energy more than 1 keV makes possible to use resists up to 1 mm thick, realizing spatial structures on the basis of LIGA-technology.

Sources

1. Book of Abstracts. 3$^{rd}$ All-Union Conference on Relativistic Particles Radiation in Crystals. May 25–30, 1988. (Nalchik, 1988).

2. Multiple reflection from surface X-ray optics (M. A Kumakhov and F. F. Komarov. PHYSICS REPORTS. A Review Section of Physics Letters, volume 191, number 5, August 1990. North-Holland.

3. U.S. Pat. No. 5,175,755 (published Dec. 29, 1992).

4. M. A. Kumakhov. State and perspectives of capillary Roentgen optics. Proceedings of SPIE—The International Society for Optical Engineering. Volume 2011, 14–16 Jul. 1993, San Diego, Calif.

5. Encyclopedic dictionary "Electronics", Moscow, "Soviet encyclopedia", 1991, pp. 254–256.

6. M. A Kumakhov. Channeling particles radiation in crystals. Moscow, Energoatomizdat, 1986.

7. V. M. Andreevsky, M. V. Guvarev, P. I. Zhidkin, M. A Kumakhov, A. V. Noskin, I. Yu. Ponomarev, Kh. Z. Ustok. X-ray waveguide system with a variable cross-section of the sections. The IV-th All-Union Conference on Interaction of Radiation with Solids. Book of Abstracts (May 15–19, 1990, Elbrus settlement, Kabardino-Balkarian ASSR, USSR, pp. 177–178).

8. V. A. Arkadiev, M. A. Kumakhov. Concentration of synchrotron radiation with capillary focusing systems. Optic of beams, pp. 43–50. Institute for Roentgen Optical Systems. Moscow, 1993.

What is claimed is:

1. A contact lithography device, comprising a soft X-rays source, a half-lens for transforming a divergent radiation of said source to a quasi-parallel radiation, said half-lens including a set of channels for transporting radiation with a total external reflection oriented along the generatrices of barrel-shaped surfaces, means for locating a mask and a substrate coated with a resist adjacent an output face of said half-lens, said lithography device including an absorbing filter for smoothing the beam intensity irregularity of emergent radiation of said half lens, wherein said absorbing filter is located between said soft X-rays source and an input face of said half-lens, a relationship of a cross-sections size of said half lens and the half-lens from said input face is chosen for providing a condition of capturing of the radiation of said soft X-rays source in the following limits:

$$0.7/E^{1.5} \leq \Psi \leq 1.3/E^{1.5},$$

where $\Psi$ is the radiation capture angle [rad];

E is radiation energy of said soft X-rays source [keV], wherein a material of reflecting surface of the channels for radiation transporting includes elements with an atomic number not more than 22, and radiation energy of said soft X-rays source is 0.6–6 keV.

2. A lithography device as defined in claim 1 wherein said soft X-rays source includes an X-ray tube having a rotating anode.

* * * * *

UNITED STATES PATENT AND TRADEMARK OFFICE
CERTIFICATE OF CORRECTION

PATENT NO. : 6,865,251 B2
DATED : March 8, 2005
INVENTOR(S) : Muradin Abubekirovich Kumakov It is certified that error appears in the above-identified patent and that said Letters Patent is hereby corrected as shown below:

Column 8,
Line 2, claim 1 is amended as follows:

1. A contact lithography device, comprising a soft X-rays source, a half-lens for transforming a divergent radiation of said source to a quasi-parallel radiation, said half-lens including a set of channels for transporting radiation with a total external reflection oriented along the generatrices of barrel-shaped surfaces, means for locating a mask and a substrate coated with a resist adjacent an output face of said half-lens, said lithography device including an absorbing filter for smoothing the beam intensity irregularity of emergent radiation of said half-lens, wherein said absorbing filter is located between said soft X-rays source and an input face of said half-lens, a relationship of a cross-sections size of said half- lens and the half-lens focal distance from said input face is chosen for providing a condition of capturing of the radiation of said soft X-rays source in the following limits:

$$0.7/E^{1.5} \leq \Psi \leq 1.3/E^{1.5},$$

where $\Psi$ is the radiation capture angle [rad];

E is radiation energy of said soft X-rays source [keV],
wherein a material of reflecting surface of the channels for radiation transporting includes elements with an atomic number not more than 22, and radiation energy of said soft X-rays source is 0.6-6 keV.

Signed and Sealed this

Twenty-seventh Day of September, 2005

JON W. DUDAS
*Director of the United States Patent and Trademark Office*